(12) United States Patent
Tao et al.

(10) Patent No.: US 10,943,517 B2
(45) Date of Patent: Mar. 9, 2021

(54) SHIFT REGISTER, METHOD FOR DRIVING THE SAME, GATE DRIVE CIRCUIT AND DISPLAY DEVICE

(71) Applicants: Hefei BOE Optoelectronics Technology Co., Ltd., Anhui (CN); BOE Technology Group Co., Ltd., Beijing (CN)

(72) Inventors: Jian Tao, Beijing (CN); Fengjing Tang, Beijing (CN); Jie Gao, Beijing (CN); Hongmin Li, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 85 days.

(21) Appl. No.: 16/288,964

(22) Filed: Feb. 28, 2019

(65) Prior Publication Data

US 2019/0371224 A1 Dec. 5, 2019

(30) Foreign Application Priority Data

May 31, 2018 (CN) .......................... 201810550184.7

(51) Int. Cl.
*G11C 19/28* (2006.01)
*G09G 3/36* (2006.01)
*G09G 3/20* (2006.01)

(52) U.S. Cl.
CPC .............. *G09G 3/20* (2013.01); *G11C 19/28* (2013.01); *G09G 2310/0286* (2013.01); *G09G 2310/06* (2013.01)

(58) Field of Classification Search
CPC ............. G09G 3/20; G09G 2310/0286; G09G 2310/06; G11C 19/28
See application file for complete search history.

(56) References Cited

U.S. PATENT DOCUMENTS 8,542,162 B2 * 9/2013 Wu ........................ G11C 19/28
345/55
9,508,450 B2 * 11/2016 Qing ...................... G11C 19/28
(Continued)

FOREIGN PATENT DOCUMENTS

CN          103000151 A    3/2013
CN          103187037 A    7/2013
(Continued)

OTHER PUBLICATIONS

Office action dated May 6, 2020 for application No. CN201810550184.7 with English translation attached.

*Primary Examiner* — Dinh T Le
(74) *Attorney, Agent, or Firm* — Nath, Goldberg & Meyer; Joshua B. Goldberg

(57) ABSTRACT

A shift register, a method for driving the same, a gate drive circuit and a display device are provided. The shift register includes a write circuit, a pull-down control circuit and an output circuit. The write circuit is configured to write a write signal provided by a write signal input terminal to a pull-up node. The pull-down control circuit is configured to write a first operating voltage provided by a first power supply terminal to a pull-down node, and write a first clock signal to the pull-down node. The output circuit is configured to write a drive signal provided by a drive signal input terminal to a drive signal output terminal, and write a second operating voltage provided by a second power supply terminal to the drive signal output terminal.

19 Claims, 6 Drawing Sheets

(56) References Cited

U.S. PATENT DOCUMENTS 9,972,262 B2 * 5/2018 Wang .................. G09G 3/20
2010/0260312 A1 10/2010 Tsai et al.

FOREIGN PATENT DOCUMENTS

| CN | 103700357 A | 4/2014 |
| CN | 104966500 A | 10/2015 |
| CN | 106910453 A | 6/2017 |
| CN | 107564459 A | 1/2018 |
| KR | 10-2014-0024994 A | 3/2014 |

* cited by examiner

SHIFT REGISTER, METHOD FOR DRIVING THE SAME, GATE DRIVE CIRCUIT AND DISPLAY DEVICE

CROSS-REFERENCE TO RELATED APPLICATIONS

The present application claims the priority of Chinese Patent Application No. 201810550184.7, filed on May 31, 2018, the contents of which are incorporated herein in their entirety by reference.

TECHNICAL FIELD

The present disclosure relates to the field of display technology, and in particular, relates to a shift register, a method for driving the same, a gate drive circuit and a display device.

BACKGROUND

A gate drive circuit generally includes a plurality of shift registers cascaded in different stages. To ensure that the shift registers can output drive signals stage by stage, in the related art, the shift registers in different stages are usually controlled to start operation sequentially and perform reset sequentially by multiplexing a drive signal output from each shift register into both a write signal and a reset signal. The gate drive circuit is generally provided in a border region of a display device, thus a width of the border region of the display device depends on the number of signal traces of the gate drive circuit.

SUMMARY

Embodiments of the present disclosure provide a shift register, a method for driving the same, a gate drive circuit and a display device.

Some embodiments of the present disclosure provide a shift register, which includes a write circuit, a pull-down control circuit and an output circuit, the write circuit, the pull-down control circuit and the output circuit are all coupled to a pull-up node, the pull-down control circuit and the output circuit are coupled to a pull-down node, wherein the write circuit is coupled to a first clock signal input terminal and a write signal input terminal, and configured to, in response to control of a first clock signal provided by the first clock signal input terminal, write a write signal provided by the write signal input terminal to the pull-up node;

the pull-down control circuit is coupled to the first clock signal input terminal and a first power supply terminal, and configured to, in response to control of the first clock signal and a voltage of the pull-up node, write a first operating voltage provided by the first power supply terminal to the pull-down node, and write the first clock signal to the pull-down node; and the output circuit is coupled to a drive signal input terminal, a drive signal output terminal and a second power supply terminal, and configured to write a drive signal provided by the drive signal input terminal to the drive signal output terminal in response to control of the voltage of the pull-up node, and write a second operating voltage provided by the second power supply terminal to the drive signal output terminal in response to control of a voltage of the pull-down node.

In some embodiments, the pull-down control circuit includes a first transistor and a second transistor;

the first transistor includes a control electrode coupled to the first clock signal input terminal, a first electrode coupled to the first power supply terminal to receive the first operating voltage, and a second electrode coupled to the pull-down node; and the second transistor includes a control electrode coupled to the pull-up node, a first electrode coupled to the pull-down node, and a second electrode coupled to the first clock signal input terminal to receive the first clock signal.

In some embodiments, the write circuit includes a third transistor; and the third transistor includes a control electrode coupled to the first clock signal input terminal, a first electrode coupled to the write signal input terminal to receive the write signal, and a second electrode coupled to the pull-up node.

In some embodiments, the drive signal input terminal is a second clock signal input terminal, and the drive signal is a second clock signal provided by the second clock signal input terminal;

the output circuit includes a fourth transistor, a fifth transistor and a first capacitor;

the fourth transistor includes a control electrode coupled to the pull-up node, a first electrode coupled to the second clock signal input terminal to receive the second clock signal, and a second electrode coupled to the drive signal output terminal;

the fifth transistor includes a control electrode coupled to the pull-down node, a first electrode coupled to the drive signal output terminal, and a second electrode coupled to the second power supply terminal to receive the second operating voltage; and the first capacitor includes a first terminal coupled to the pull-up node and a second terminal coupled to the drive signal output terminal.

In some embodiments, the output circuit is further coupled to a cascade signal input terminal and a cascade signal output terminal;

the output circuit includes a cascade signal output sub-circuit and a drive signal output sub-circuit;

the cascade signal output sub-circuit is coupled to the pull-up node, the pull-down node, the cascade signal input terminal, the cascade signal output terminal and the second power supply terminal, and configured to write a cascade signal provided by the cascade signal input terminal to the cascade signal output terminal in response to control of the voltage of the pull-up node, and write the second operating voltage provided by the second power supply terminal to the cascade signal output terminal in response to the control of the voltage of the pull-down node; and the drive signal output sub-circuit is coupled to the cascade signal output terminal, the pull-down node, the drive signal input terminal, the drive signal output terminal and the second power supply terminal, and configured to write the drive signal provided by the drive signal input terminal to the drive signal output terminal in response to control of a voltage of the cascade signal output terminal, and write the second operating voltage provided by the second power supply terminal to the drive signal output terminal in response to the control of the voltage of the pull-down node.

In some embodiments, the cascade signal input terminal is a second clock signal input terminal, and the cascade signal is a second clock signal provided by the second clock signal input terminal;

the cascade signal output sub-circuit includes a fourth transistor, a fifth transistor and a first capacitor;

the fourth transistor includes a control electrode coupled to the pull-up node, a first electrode coupled to the second clock signal input terminal to receive the second clock signal, and a second electrode coupled to the cascade signal output terminal;

the fifth transistor includes a control electrode coupled to the pull-down node, a first electrode coupled to the cascade signal output terminal, and a second electrode coupled to the second power supply terminal to receive the second operating voltage; and the first capacitor includes a first terminal coupled to the pull-up node and a second terminal coupled to the cascade signal output terminal.

In some embodiments, the drive signal input terminal is a third power supply terminal, and the drive signal is a third operating voltage provided by the third power supply terminal;

the drive signal output sub-circuit includes a sixth transistor and a seventh transistor;

the sixth transistor includes a control electrode coupled to the cascade signal output terminal, a first electrode coupled to the third power supply terminal to receive the third operating voltage, and a second electrode coupled to the drive signal output terminal; and the seventh transistor includes a control electrode coupled to the pull-down node, a first electrode coupled to the drive signal output terminal, and a second electrode coupled to the second power supply terminal to receive the second operating voltage.

In some embodiments, the shift register further includes a feedback-loop circuit, wherein the feedback-loop circuit is coupled to the pull-up node, and configured to receive the voltage of the pull-up node, and cause the voltage of the pull-up node to be self-boosted based on positive feedback of the feedback-loop circuit.

In some embodiments, the feedback-loop circuit includes an eighth transistor, a ninth transistor and a tenth transistor;

the eighth transistor includes a control electrode coupled to a fourth power supply terminal, a first electrode coupled to the fourth power supply terminal to receive a fourth operating voltage provided by the fourth power supply terminal, and a second electrode coupled to a first electrode of the ninth transistor;

the ninth transistor includes a control electrode coupled to the pull-up node, the first electrode coupled to a control electrode of the tenth transistor, and a second electrode coupled to a fifth power supply terminal to receive a fifth operating voltage provided by the fifth power supply terminal; and the tenth transistor includes a first electrode coupled to the pull-up node, and a second electrode coupled to the fifth power supply terminal to receive the fifth operating voltage.

In some embodiments, the shift register further includes a voltage regulator circuit, wherein the voltage regulator circuit is coupled to the pull-down node, and configured to stabilize the voltage of the pull-down node.

In some embodiments, the voltage regulator circuit includes a second capacitor; and the second capacitor includes a first terminal coupled to the pull-down node and a second terminal coupled to the second power supply terminal.

Embodiments of the present disclosure provide a method for driving a shift register, wherein the shift register is the shift register according to any one of the foregoing embodiments of the present disclosure, the method includes steps of:

in a precharge stage, writing the write signal in a first level state to the pull-up node by the write circuit, writing the first operating voltage to the pull-down node by the pull-down control circuit, and writing the second operating voltage to the drive signal output terminal by the output circuit;

in a drive stage, causing the write circuit to stop writing, writing the first clock signal in a second level state to the pull-down node by the pull-down control circuit, and writing the drive signal to the drive signal output terminal by the output circuit; and in a reset stage, writing the write signal in the second level state to the pull-up node by the write circuit, writing the first operating voltage to the pull-down node by the pull-down control circuit, and writing the second operating voltage to the drive signal output terminal by the output circuit.

Embodiments of the present disclosure provide a gate drive circuit, which includes a plurality of shift registers cascaded in respective stages, wherein each of the plurality of shift registers is the shift register according to any one of the foregoing embodiments of the present disclosure;

the write signal input terminal of the shift register in a first stage is coupled to a frame trigger signal input terminal; and the write signal input terminal of each of the shift registers in the remaining stages other than the first stage is coupled to one signal output terminal of the shift register in its previous stage.

In some embodiments, the output circuit of each of the shift registers is further coupled to a cascade signal input terminal and a cascade signal output terminal;

the output circuit includes a cascade signal output sub-circuit and a drive signal output sub-circuit; and the write signal input terminal of each of the shift registers in the remaining stages other than the first stage is coupled to the cascade signal output terminal of the shift register in its previous stage.

Embodiments of the present disclosure provide a display device, which includes the gate drive circuit according to any one of the foregoing embodiments of the present disclosure.

DETAILED DESCRIPTION

To enable one of ordinary skill in the art to better understand technical solutions of the present disclosure, a shift register, a method for driving the same, a gate drive circuit and a display device provided by embodiments of the present disclosure will be described in detail below with reference to the accompanying drawings.

The inventors of the present disclosure have found that, in the related art, a drive signal output from a shift register in the present stage is employed to not only drive a gate line in a corresponding row, but also function as a reset signal for a shift register in the previous stage and a write signal for a shift register in the next stage. For this purpose, it is necessary to provide signal traces between a drive signal output terminal of the shift register in the present stage and a reset signal input terminal of the shift register in the previous stage, and provide signal traces between the drive signal output terminal of the shift register in the present stage and a write signal input terminal of a shift register in the next stage.

The above shift register has a large number of signal traces, and the arrangement of the signal traces occupies a large space, causing the overall size of a corresponding gate drive circuit to be large, which is disadvantageous for the border region of the display device to be narrowed down.

Figure 1:
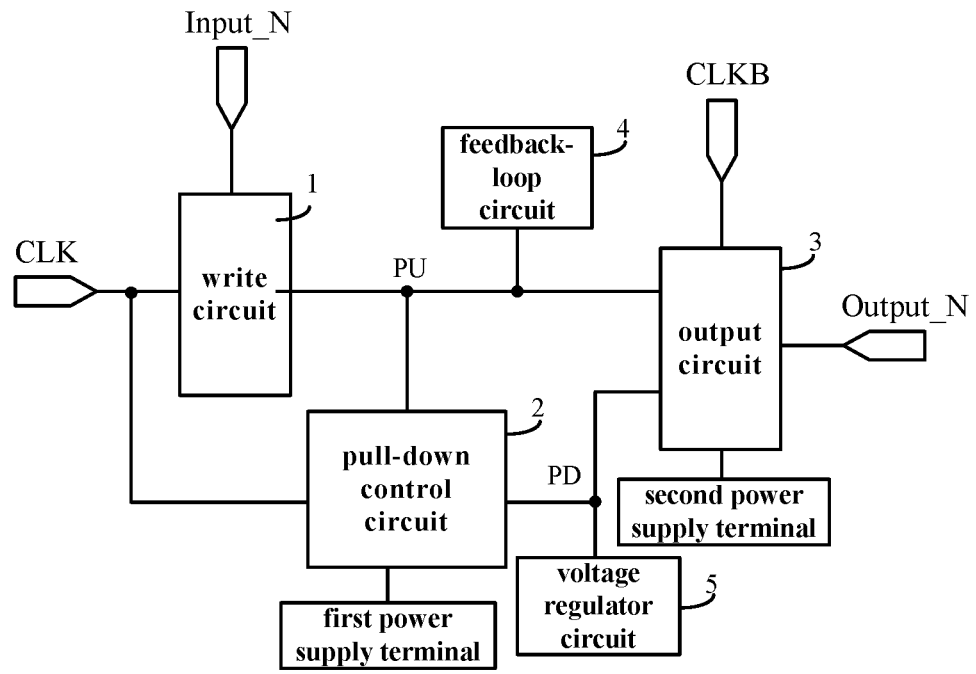
FIG. 1 is a schematic diagram showing a circuit structure of a shift register according to an embodiment of the present disclosure.

As described above, the gate drive circuit may include a plurality of (e.g., N) shift registers cascaded in respective stages, and the plurality of (e.g., N) shift registers may be the same or substantially the same. FIG. 1 is a schematic diagram of a circuit structure of one (e.g., $N^{th}$) shift register according to an embodiment of the present disclosure. As shown in FIG. 1, the shift register may include a write circuit 1, a pull-down control circuit 2, and an output circuit 3. The write circuit 1, the pull-down control circuit 2 and the output circuit 3 are all coupled to each other at a pull-up node PU, and the pull-down control circuit 2 and the output circuit 3 are coupled to each other at a pull-down node PD.

For example, the write circuit 1 is coupled to a first clock signal input terminal CLK and a write signal input terminal Input_N (in a case where distinguishing is not necessary, the reference symbol "Input_N" may be simply referred to as "Input" hereinafter). The write circuit 1 is configured to, in response to control of a first clock signal provided by the first clock signal Input terminal CLK, write a write signal provided by the write signal input terminal Input to the pull-up node PU, for example, in a precharge stage and a reset stage.

The pull-down control circuit 2 is coupled to the first clock signal input terminal CLK and a first power supply terminal, and configured to, in response to control of the first clock signal and a voltage of the pull-up node PU, write a first operating voltage provided by the first power supply terminal to the pull-down node PD, for example, in the precharge stage and the reset stage, and write the first clock signal to the pull-down node PD, for example, in a drive stage.

The output circuit 3 is coupled to a drive signal input terminal (e.g., a second clock signal input terminal CLKB), a drive signal output terminal Output_N and a second power supply terminal, and configured to write a drive signal provided by the drive signal input terminal CLKB to the drive signal output terminal Output_N in response to control of the voltage of the pull-up node PU, for example, in the drive stage, and write a second operating voltage provided by the second power supply terminal to the drive signal output terminal Output_N in response to control of a voltage of the pull-down node PD, for example, in the reset stage.

In the present embodiment, in the reset stage, the write circuit 1 writes the write signal in a second level state to the pull-up node PU under the control of the first clock signal, to reset the pull-up node PU. At the same time, the pull-down control circuit 2 writes the first operating voltage to the pull-down node PD under the control of the first clock signal and the voltage of the pull-up node PU. The output circuit 3 writes the second operating voltage to the drive signal output terminal Output_N to reset the drive signal output terminal Output_N, under the control of the voltage of the pull-down node PD.

It can be seen that, the shift register according to the present embodiment can implement a self-reset without a reset signal. Compared with a shift register in the related art, the shift register according to the present embodiment can omit the reset signal input terminal and a signal trace for coupling the reset signal input terminal to the drive signal output terminal Output_N of the shift register in the next stage, thereby reducing the size of a gate drive circuit including the shift register, which is advantageous for a border region of a display device to be narrowed down.

In the present embodiment, the shift register may further include a feedback-loop circuit 4 coupled to the pull-up node PU, configured to receive the voltage of the pull-up node PU, and cause the voltage of the pull-up node PU to be self-boosted based on a positive-feedback process to improve the anti-interference capability of the pull-up node PU.

For example, the shift register may further include a voltage regulator circuit 5 coupled to the pull-down node PD, and configured to stabilize the voltage of the pull-down node PD.

The shift register according to the present embodiment can implement a self-reset without a reset signal. Compared with a shift register in the related art, the shift register according to the present embodiment can omit the reset signal input terminal and a signal trace for the reset signal input terminal, thereby reducing the size of a gate drive circuit including the shift register, which is advantageous for a border region of a display device to be narrowed down.

Figure 2:
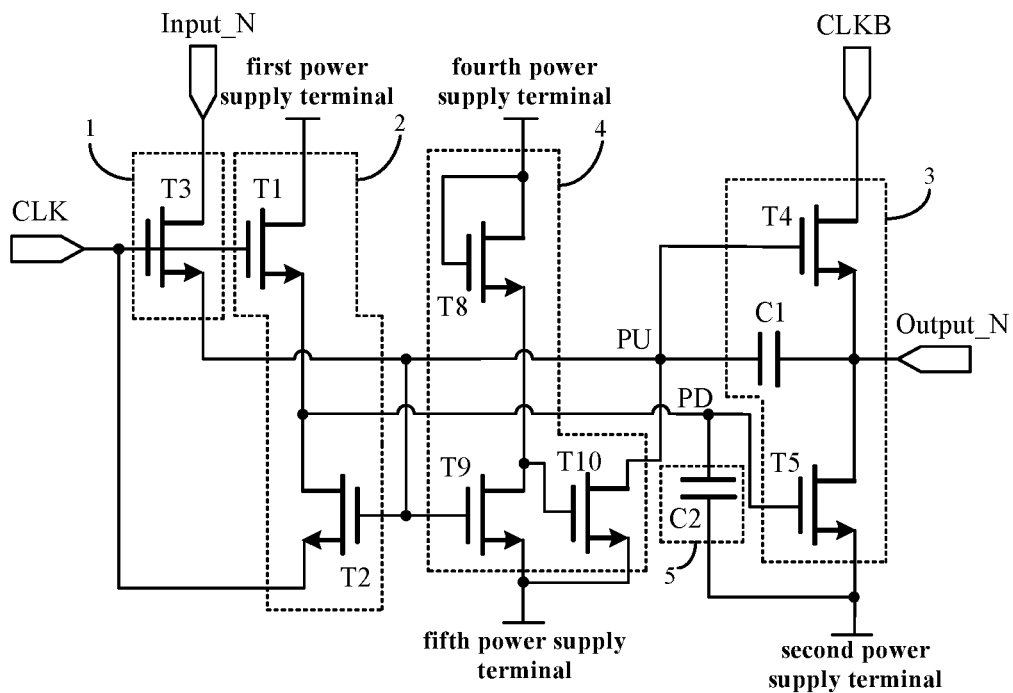
FIG. 2 is a schematic diagram showing a circuit structure of another shift register according to an embodiment of the present disclosure.

FIG. 2 is a schematic diagram showing a circuit structure of a shift register according to an embodiment of the present disclosure. The shift register shown in FIG. 2 may be an implement of the shift register shown in FIG. 1.

For example, the pull-down control circuit 2 may include a first transistor T1 and a second transistor T2.

The first transistor T1 includes a control electrode coupled to the first clock signal input terminal CLK, a first electrode coupled to the first power supply terminal, and a second electrode coupled to the pull-down node PD.

The second transistor T2 includes a control electrode coupled to the pull-up node PU, a first electrode coupled to the pull-down node PD, and a second electrode coupled to the first clock signal input terminal CLK to receive the first clock signal.

For example, the write circuit 1 may include a third transistor T3. The third transistor T3 includes a control electrode coupled to the first clock signal input terminal CLK, a first electrode coupled to the write signal input terminal Input to receive the write signal, and a second electrode coupled to the pull-up node PU.

As described above, the drive signal input terminal may be the second clock signal input terminal CLKB, and the drive signal may be a second clock signal provided by the second clock signal input terminal CLKB. The second clock signal may have a phase opposite to that of the first clock signal.

The output circuit 3 may include a fourth transistor T4, a fifth transistor T5 and a first capacitor C1.

The fourth transistor T4 includes a control electrode coupled to the pull-up node PU, a first electrode coupled to the second clock signal input terminal CLKB to receive the second clock signal, and a second electrode coupled to the drive signal output terminal Output_N.

The fifth transistor T5 includes a control electrode coupled to the pull-down node PD, a first electrode coupled to the drive signal output terminal Output_N, and a second electrode coupled to the second power supply terminal.

The first capacitor C1 includes a first terminal coupled to the pull-up node PU and a second terminal coupled to the drive signal output terminal Output_N.

For example, the feedback-loop circuit 4 may include an eighth transistor T8, a ninth transistor T9 and a tenth transistor T10.

The eighth transistor T8 includes a control electrode coupled to a fourth power supply terminal, a first electrode coupled to the fourth power supply terminal to receive a fourth operating voltage provided by the fourth power supply terminal, and a second electrode coupled to a first electrode of the ninth transistor T9.

The ninth transistor T9 includes a control electrode coupled to the pull-up node PU, the first electrode coupled to a control electrode of the tenth transistor T10, and a second electrode coupled to a fifth power supply terminal to receive a fifth operating voltage provided by the fifth power supply terminal.

The tenth transistor T10 includes a first electrode coupled to the pull-up node PU, and a second electrode coupled to the fifth power supply terminal to receive the fifth operating voltage.

For example, the voltage regulator circuit 5 may include a second capacitor C2. The second capacitor C2 includes a first terminal coupled to the pull-down node PD and a second terminal coupled to the second power supply terminal.

In the present embodiment, each of the above transistors may be one of a polysilicon thin film transistor, an amorphous silicon thin film transistor, and an oxide thin film transistor. Among the transistors of various types listed above, an electron mobility of a polysilicon active layer is the largest, is larger than an electron mobility of an oxide active layer by one order of magnitude, and is larger than an electron mobility of an amorphous silicon active layer by two orders of magnitude. Thus, in the case of high resolution or large drive load, the polysilicon thin film transistor and the oxide thin film transistor have significant advantages. To achieve the same charge rate, the size of each of the polysilicon thin film transistor and the oxide thin film transistor may be smaller, such that the size of the shift register is relatively small, and the overall size of a gate drive circuit including the shift register is relatively small, which is advantageous for a border region of a display device to be narrowed down. Further, in consideration of poor film formation uniformity of the polysilicon active layer, each of the transistors of the shift register according to an embodiment of the present disclosure may be an oxide thin film transistor.

In the case where each transistor of the shift register according to an embodiment of the present disclosure is an N-type transistor, the "control electrode" in the embodiment may refer to a gate of the transistor, the "first electrode" may refer to a source of the transistor, and the corresponding "second electrode" may refer to a drain of the transistor. However, the present disclosure is not limited thereto. For example, in the case where each transistor of the shift register according to an embodiment of the present disclosure is a P-type transistor, the "control electrode" in the embodiment may refer to a gate of a transistor, the "first electrode" may refer to a drain of the transistor, and the corresponding "second electrode" may refer to a source of the transistor. Further, the transistors of the shift register according to an embodiment of the present disclosure may be a combination of an N-type transistor and a P-type transistor. In this case, the "first electrode" and the "second electrode" may be defined as described above for the N-type transistor and the P-type transistor, respectively.

In the present embodiment, for example, all of the transistors of the shift register may be N-type thin film transistors, and may be manufactured simultaneously by using the same manufacturing processes, thereby shortening the production cycle of the shift register. It should be noted that the case where all of the transistors of the shift register are N-type thin film transistors is only an implementation of the present embodiment, and the present disclosure is not limited thereto. For example, as described above, all of the transistors of the shift register may be P-type thin film transistors or a combination of N-type transistors and P-type transistors.

The operation of the shift register shown in FIG. 2 will be described in detail below with reference to the accompanying drawings. Here, it is assumed that all of the transistors of the shift register are N-type thin film transistors. The operating voltage provided by the first power supply terminal and the operating voltage provided by the fourth power supply terminal are high-level operating voltages VDD, and the operating voltage provided by the second power supply terminal and the operating voltage provided by the fifth power supply terminal are low-level operating voltages VSS.

Figure 3:
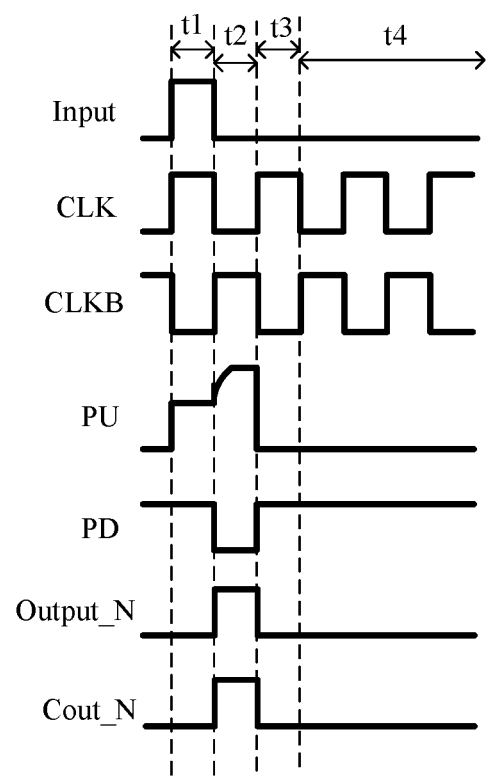
FIG. 3 is a schematic timing diagram of a shift register according to an embodiment of the present disclosure.

FIG. 3 is a schematic timing diagram of a shift register according to an embodiment of the present disclosure. As shown in FIG. 3, an operation process of the shift register may include three stages which are a precharge stage t1, a drive stage t2, and a reset stage t3.

In the precharge stage t1, the write signal provided by the write signal input terminal Input is in a high level state (which may be referred to as a first level state), the first clock signal provided by the first clock signal input terminal CLK is in the high level state, and the second clock signal provided by the second clock signal input terminal CLKB is in a low level state (which may be referred to as a second level state).

Since the first clock signal is in the high level state, the first transistor T1 and the third transistor T3 are turned on. In this case, the write signal in the high level state is written to the pull-up node PU via the third transistor T3, the voltage at the pull-up node PU is at a high level. At the same time, the high level operating voltage VDD provided by the first power supply terminal is written to the pull-down node PD via the first transistor T1, and the voltage at the pull-down node PD is at a high level.

Since the voltage at the pull-up node PU is at the high level, the second transistor T2, the fourth transistor T4 and the ninth transistor T9 are all turned on. Here, since the second transistor T2 is in a turned-on state, the first clock signal in the high level state is written to the pull-down node PD via the second transistor T2. That is, in the precharge stage, the pull-down node PD is charged by both the high level operating voltage VDD and the first clock signal in the high level state, to ensure that the voltage at the pull-down node PD is at the high level. The second capacitor C2 may stabilize the voltage at the pull-down node PD.

Further, since the ninth transistor T9 is turned on, the low level operating voltage VSS provided by the fifth power supply terminal may be written to the control electrode of the tenth transistor T10 via the ninth transistor T9, and the tenth transistor T10 is turned off at this time. It should be noted that, during this process, the eighth transistor T8 may function as a resistor.

Since the fourth transistor T4 is turned on, the second clock signal in the low level state is written to the drive signal output terminal Output_N via the fourth transistor T4. At the same time, since the voltage at the pull-down node PD is at the high level, the fifth transistor T5 is turned on, and the low level operating voltage VSS provided by the second power supply terminal is written to the drive signal output terminal Output_N via the fifth transistor T5. That is, the drive signal output terminal Output_N may output a low level signal.

In the drive stage t2, the write signal provided by the write signal input terminal Input is in the low level state, the first clock signal provided by the first clock signal input terminal CLK is in the low level state, and the second clock signal provided by the second clock signal input terminal CLKB is in the high level state.

Since the first clock signal is in the low level state, the first transistor T1 and the third transistor T3 are turned off.

The second transistor T2, the fourth transistor T4 and the ninth transistor T9 remain turned on, and the tenth transistor T10 remains turned off. Since the second transistor T2 is turned on, the first clock signal in the low level state is written to the pull-down node PD via the second transistor T2, such that the voltage at the pull-down node PD is at the low level, and the fifth transistor T5 is turned off. Since the fourth transistor T4 remains turned on, the second clock signal in the high level state is written to the drive signal output terminal Output_N via the fourth transistor T4. That is, the drive signal output terminal Output_N may output a high level signal.

At the same time, the voltage of the pull-up node PU is pulled up to a higher level under the bootstrapping effect of the first capacitor C1.

In the reset stage t3, the write signal provided by the write signal input terminal Input is in the low level state, the first clock signal provided by the first clock signal input terminal CLK is in the high level state, and the second clock signal provided by the second clock signal input terminal CLKB is in the low level state.

Since the first clock signal is in the high level state, the first transistor T1 and the third transistor T3 are turned on. In this case, the write signal in the low level state is written to the pull-up node PU via the third transistor T3, such that the voltage at the pull-up node PU is at the low level, and a reset of the pull-up node PU is completed. At the same time, the high level operating voltage VDD provided by the first power supply terminal is written to the pull-down node PD via the first transistor T1, such that the voltage at the pull-down node PD is at the high level.

It should be noted that, since the voltage at the pull-up node PU is at the low level, the second transistor T2, the fourth transistor T4 and the ninth transistor T9 are all turned off.

In this case, for the feedback-loop circuit 4, since the ninth transistor T9 is turned off, the high level operating voltage VDD provided by the fourth power supply terminal may be written to the control electrode of the tenth transistor T10 via the eighth transistor T8, such that the tenth transistor T10 is turned on.

Further, the low level operating voltage VSS provided by the fifth power supply terminal may be written to the pull-up node PU via the tenth transistor T10, to increase the voltage of the pull-up node PU, thereby improving the anti-noise capability of the pull-up node PU.

Further, since the voltage of the pull-down node PD is at the high level, the fifth transistor T5 is turned on, and the low level operating voltage VSS provided by the second power supply terminal is written to the drive signal output terminal Output_N via the fifth transistor T5. That is, the drive signal output terminal Output_N may output a low level signal.

It should be noted that, the method for driving the shift register may include a maintaining stage t4 after the reset stage t3 is ended. In the maintaining stage t4, since the since the write signal provided by the write signal input terminal is always in a low level state (e.g., the writing of the write circuit may be stopped), both the first transistor T1 and the third transistor T3 will be turned on in the case where the first clock signal is in the high level state. Here, since the first transistor T1 is turned on, the high level operating voltage provided by the first power supply terminal is written to the pull-down node PD via the first transistor T1, to correct the voltage of the pull-down node PD, thereby ensuring that the voltage of the pull-down node PD is always at the high level, the fifth transistor T5 is always in the turned-on state, and the drive signal output terminal Output_N always outputs a low level signal, during the maintaining stage t4. At the same time, the second capacitor C2 may maintain the voltage of the pull-down node PD to a certain degree. Since the third transistor T3 is turned on, the write signal in the low level state will be written to the pull-up node PU via the third transistor T3, to correct an electric potential of the pull-up node PU, thereby ensuring the voltage of the pull-up node PU is always at the low level, and the fourth transistor T4 is always in a turned-off state, during the maintaining stage t4. At the same time, the feedback-loop circuit 4 may cause the voltage of the pull-up node PU to be self-boosted based on a positive-feedback process of the feedback-loop circuit 4, to improve the anti-noise capacity of the pull-up node PU.

When the write signal becomes to be at the high level again, the maintaining stage t4 is ended, and the operation process of the shift register may begin a next cycle.

In the present embodiment, the shift register has one signal output terminal (e.g., the drive signal output terminal Output_N shown in FIG. 2), and this signal output terminal is coupled to both a gate line in a corresponding row and the write signal input terminal Input of the shift register in the next stage, such that a signal output from this signal output terminal may drive a gate line in the corresponding row and function as the write signal for the shift register in the next stage.

The shift register according to the present embodiment can implement a self-reset without a reset signal. Compared with a shift register in the related art, the shift register according to the present embodiment can omit the reset signal input terminal and a signal trace for the reset signal input terminal, thereby reducing the size of a gate drive circuit including the shift register, which is advantageous for a border region of a display device to be narrowed down.

Figure 4:
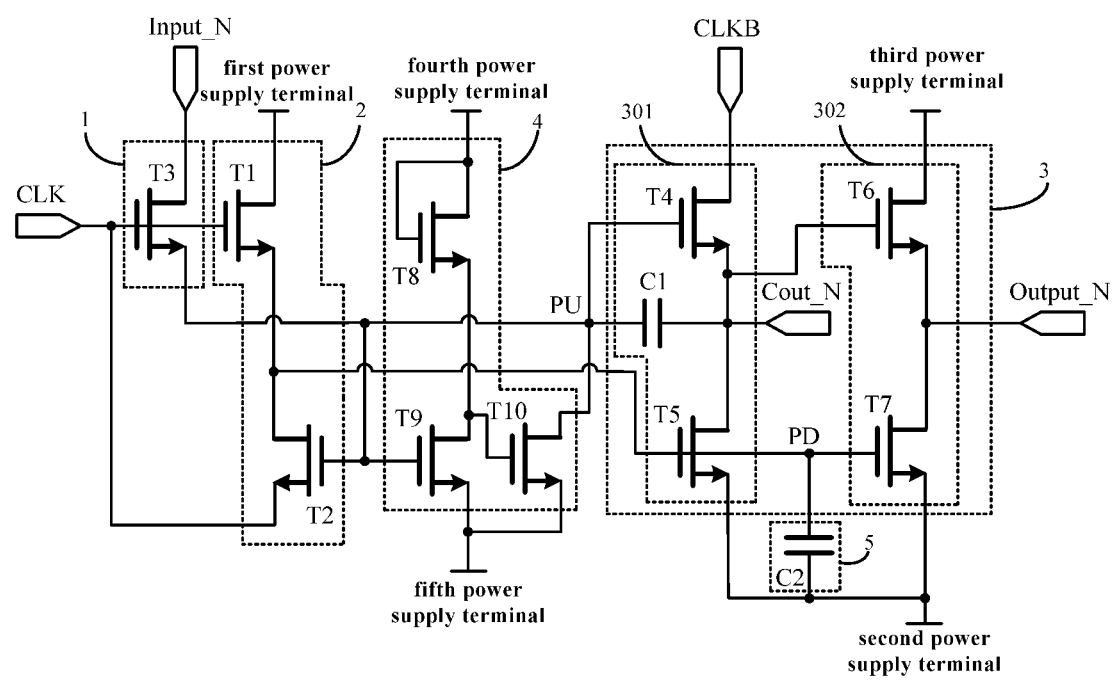
FIG. 4 is a schematic diagram showing a circuit structure of still another shift register according to an embodiment of the present disclosure.

FIG. 4 is a schematic diagram showing a circuit structure of a shift register according to an embodiment of the present disclosure. The shift register shown in FIG. 4 differs from that shown in FIG. 2 in that, the output circuit 3 of the shift register shown in FIG. 4 is further coupled to a cascade signal input terminal (e.g., the second clock signal input terminal CLKB) and a cascade signal output terminal Cout_N, and the output circuit 3 may include a cascade signal output sub-circuit 301 and a drive signal output sub-circuit 302.

For example, the cascade signal output sub-circuit 301 is coupled to the pull-up node PU, the pull-down node PD, the cascade signal input terminal CLKB, the cascade signal output terminal Cout_N and the second power supply terminal, and is configured to write a cascade signal provided by the cascade signal input terminal CLKB to the cascade signal output terminal Cout_N in response to the control of the voltage of the pull-up node PU, and write the second operating voltage provided by the second power supply terminal to the cascade signal output terminal Cout_N in response to the control of the voltage of the pull-down node PD.

The drive signal output sub-circuit 302 is coupled to the cascade signal output terminal Cout_N, the pull-down node PD, the drive signal input terminal (e.g., the third power supply terminal), the drive signal output terminal Output_N and the second power supply terminal, and is configured to write the drive signal provided by the drive signal input terminal to the drive signal output terminal Output_N in response to the control of a voltage of the cascade signal output terminal Cout_N and the voltage of the pull-down node PD during the drive stage, and write the second operating voltage provided by the second power supply terminal to the drive signal output terminal Output_N during the reset stage.

As described above, the cascade signal input terminal may be the second clock signal input terminal CLKB, and the cascade signal may be the second clock signal provided by the second clock signal input terminal CLKB. The cascade signal output sub-circuit 301 may include a fourth transistor T4, a fifth transistor T5 and a first capacitor C1.

The fourth transistor T4 includes a control electrode coupled to the pull-up node PU, a first electrode coupled to the second clock signal input terminal CLKB to receive the second clock signal, and a second electrode coupled to the cascade signal output terminal Cout_N.

The fifth transistor T5 includes a control electrode coupled to the pull-down node PD, a first electrode coupled to the cascade signal output terminal Cout_N, and a second electrode coupled to the second power supply terminal to receive the second operating voltage.

The first capacitor C1 includes a first terminal coupled to the pull-up node PU, and a second terminal coupled to the cascade signal output terminal Cout_N.

As describe above, the drive signal input terminal may be the third power supply terminal, and the drive signal provided by the drive signal input terminal may be the third operating voltage provided by third power supply terminal. The drive signal output sub-circuit 302 may include a sixth transistor T6 and a seventh transistor T7.

The sixth transistor T6 includes a control electrode coupled to the cascade signal output terminal Cout_N, a first electrode coupled to the third power supply terminal, and a second electrode coupled to the drive signal output terminal Output_N.

The seventh transistor T7 includes a control electrode coupled to the pull-down node PD, a first electrode coupled to the drive signal output terminal Output_N, and a second electrode coupled to the second power supply terminal to receive the second operating voltage.

In the present embodiment, the shift register has two signal output terminals, of which one signal output terminal is coupled to a gate line for a row corresponding to the shift register in the present stage and configured to provide a drive signal to the gate line, the other signal output terminal is coupled to the write signal input terminal Input of the shift register in the next stage and configured to provide the write signal. In the present embodiment, the drive signal output terminal Output_N may be coupled to the gate line for a corresponding row, and the cascade signal output terminal Cout_N may be coupled to the write signal input terminal Input of the shift register in the next stage.

An operation timing of the shift register shown in FIG. 4 may be the same as that of the shift register shown in FIG. 2, and detailed description thereof may refer to FIG. 3 and the foregoing description. An operation process of the shift register shown in FIG. 4 may include three stages which are a precharge stage t1, a drive stage t2 and a reset stage t3.

The detailed operations of the transistors of the write circuit 1, the pull-down control circuit 2 and the feedback-loop circuit 4 will not be repeated here. For brevity, only the operations of the output circuit 3 according to the present embodiment in the three stages will be described in detail below.

In the precharge stage t1, the voltage of the pull-up node PU is at the high level, and the voltage of the pull-down node PD is at the high level, as can be seen from the embodiment shown in FIG. 3.

For the cascade signal output sub-circuit 301, since the voltage of the pull-up node PU is at the high level and the fourth transistor T4 is turned on, the second clock signal in the low level state is written to the cascade signal output terminal Cout_N via the fourth transistor T4. At the same time, since the voltage of the pull-down node PD is at the high level and the fifth transistor T5 is turned on, the low level operating voltage VSS provided by the second power supply terminal is written to the cascade signal output terminal Cout_N via the fifth transistor T5. In this case, the cascade signal output terminal Cout_N outputs a low level signal.

For the drive signal output sub-circuit 302, since the cascade signal output terminal Cout_N outputs the low level signal, the sixth transistor T6 is turned off. At the same time, since the voltage of the pull-down node PD is at the high level, the seventh transistor T7 is turned on, and the low level operating voltage VSS provided by the second power supply terminal is written to the drive signal output terminal Output_N via the seventh transistor T7. In this case, the drive signal output terminal Output_N outputs a low level signal.

In the drive stage t2, the voltage of the pull-up node PU is at the high level, and the voltage of the pull-down node PD is at the low level, as can be seen from the embodiment shown in FIG. 3.

For the cascade signal output sub-circuit 301, since the voltage of the pull-up node PU is at the high level, the fourth transistor T4 remains turned on, and the second clock signal in the high level state is written to the cascade signal output terminal Cout_N via the fourth transistor T4. Under the bootstrapping effect of the first capacitor C1, the voltage of the pull-up node PU is pulled up to a higher level. At the same time, since the voltage of the pull-down node PD is at the low level, the fifth transistor T5 is turned off. In this case, the cascade signal output terminal Cout_N outputs a high level signal.

For the drive signal output sub-circuit 302, since the cascade signal output terminal Cout_N outputs the high level signal, the sixth transistor T6 is turned on, and the high level operating voltage VDD provided by the third power supply terminal is written to the drive signal output terminal Output_N via the sixth transistor T6. At the same time, since the voltage of the pull-down node PD is at the low level, the seventh transistor T7 is turned off. In this case, the drive signal output terminal Output_N outputs a high level signal.

It should be noted that, in consideration of a relative large resistance and a relative large amount of noise of a gate line, and in consideration of the fact that a constant voltage signal (i.e., the third operating voltage) provided by the third power supply terminal has effective anti-noise capability, the drive signal output terminal Output_N is coupled to a gate line in a corresponding row, so as to improve the driving effect of the shift register on the gate line.

In the reset stage t3, the voltage of the pull-up node PU is at the low level, and the voltage of the pull-down node PD is at the high level, as can be seen from the embodiment shown in FIG. 3.

For the cascade signal output sub-circuit 301, since the voltage of the pull-up node PU is at the low level, the fourth transistor T4 is turned off. At the same time, since the voltage of the pull-down node PD is at the high level, the fifth transistor T5 is turned on, and the low level operating voltage VSS provided by the second power supply terminal is written to the cascade signal output terminal Cout_N via the fifth transistor T5. In this case, the cascade signal output terminal Cout_N outputs a low level signal.

For the drive signal output sub-circuit 302, since the cascade signal output terminal Cout_N outputs the low level signal, the sixth transistor T6 is turned off. At the same time, since the voltage of the pull-down node PD is at the high level, the seventh transistor T7 is turned on, and the low level operating voltage VSS provided by the second power supply terminal is written to the cascade signal output terminal Cout_N via the seventh transistor T7. In this case, the drive signal output terminal Output_N outputs a low level signal.

It should be noted that, the method for driving the shift register may further include a maintaining stage t4 after the reset stage t3 is ended. In the maintaining stage t4, the voltage of the pull-up node PU is always at the low level, and the voltage of the pull-down node PD is always at the high level, as can be seen from the embodiment shown in FIG. 3. Thus, the fourth transistor T4 and the sixth transistor T6 always remain in the turned-off state, the fifth transistor T5 and the seventh transistor T7 always remain in the turned-on state, the cascade signal output terminal Cout_N always outputs the low level signal, and the drive signal output terminal Output_N always outputs the low level signal. The maintaining stage t4 is not ended until the write signal becomes to be at the high level again. Thereafter, the operation process of the shift register may begin a next cycle.

From the foregoing description, it can be seen that the signal output from the drive signal output terminal Output_N and the signal output from the cascade signal output terminal Cout_N are always identical to each other.

In the present embodiment, the reliability of the signals is improved by providing two signal output terminals (i.e., the drive signal output terminal Output_N and the cascade signal output terminal Cout_N), of which one signal output terminal provides the drive signal to a corresponding gate line, and the other signal output terminal provides the write signal (i.e., a cascade signal) to the shift register in the next stage.

Figure 5:
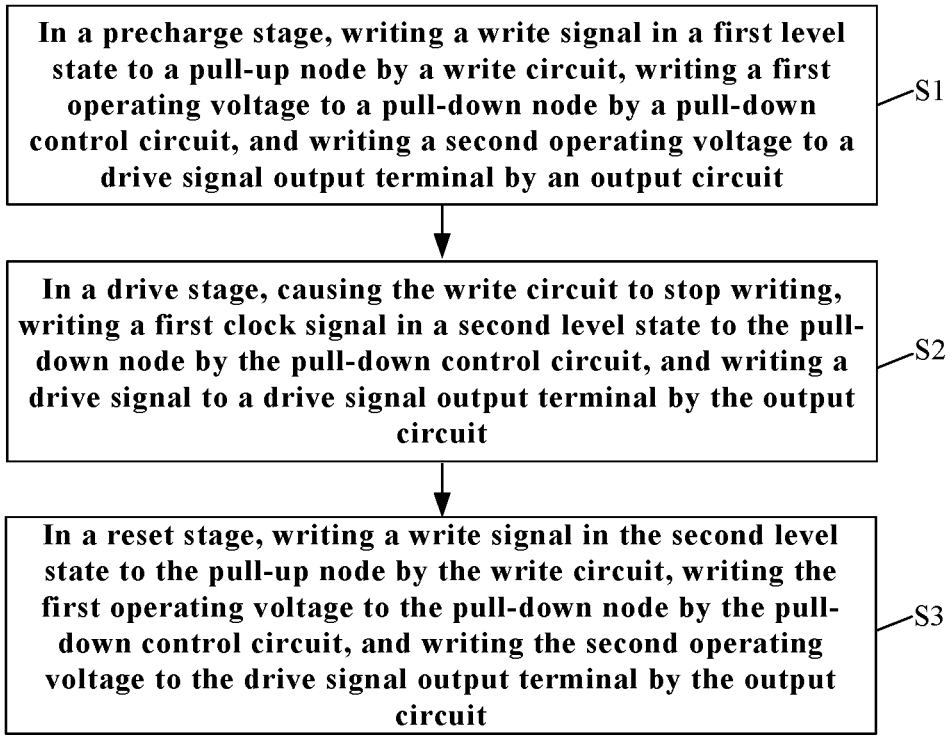
FIG. 5 is a schematic flowchart showing a method for driving a shift register according to an embodiment of the present disclosure.

FIG. 5 is a schematic flowchart showing a method for driving a shift register according to an embodiment of the present disclosure. As shown in FIG. 5, the shift register may be the shift register provided by the embodiment shown in FIG. 1, 2 or 4. The method may include the following steps S1 to S3.

The step S1 is as follows. In a precharge stage, the write signal in the first level state is written to the pull-up node by the write circuit, the first operating voltage is written to the pull-down node by the pull-down control circuit, and the second operating voltage is written to the drive signal output terminal by the output circuit.

The step S2 is as follows. In a drive stage, the write circuit is caused to stop writing, the first clock signal in the second level state is written to the pull-down node by the pull-down control circuit, and the drive signal is written to the drive signal output terminal by the output circuit.

The step S3 is as follows. In a reset stage, the write signal in the second level state is written to the pull-up node by the write circuit, the first operating voltage is written to the pull-down node by the pull-down control circuit, and the second operating voltage is written to the drive signal output terminal by the output circuit.

Detailed description of the above steps may be referred to the foregoing description with reference to FIG. 3, and will not be repeated here. In the foregoing embodiments, the first level state may be a high level state, and the second level state may be a low level state. Further, the first power supply terminal, the third power supply terminal and the fourth power supply terminal, each of which provides the high level operating voltage VDD, may be identical to each other, and the second power supply terminal and the fifth power supply terminal, each of which provides the low level operating voltage VSS, may be identical to each other.

Figure 6:
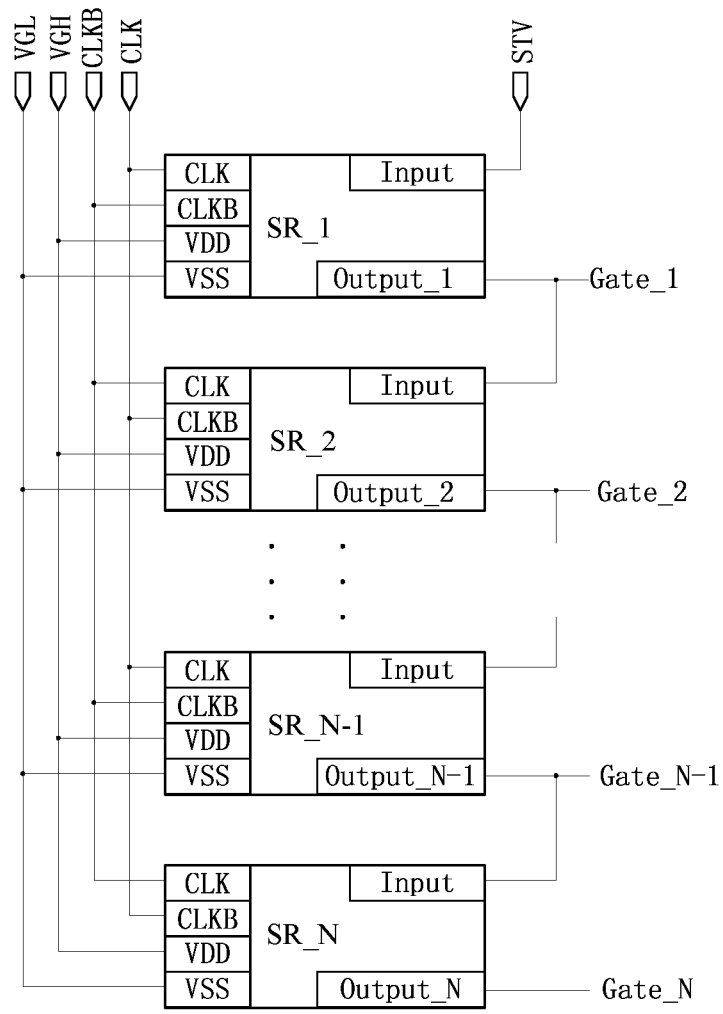
FIG. 6 is a schematic diagram showing a structure of a gate drive circuit according to an embodiment of the present disclosure.

FIG. 6 is a schematic diagram showing a structure of a gate drive circuit according to an embodiment of the present disclosure. As shown in FIG. 6, the gate drive circuit may include a plurality of shift registers SR_1, SR_2, . . . , SR_N−1 and SR_N which are cascaded in respective stages, and each of the shift registers SR_1, SR_2, . . . , SR_N−1 and SR_N may be the shift register according to the embodiment shown in FIG. 1, 2 or 4.

In the present embodiment, the write signal input terminal Input of the shift register SR_1 in a first stage is coupled to a frame trigger signal input terminal STV. The write signal input terminals Input of the shift registers SR_2, . . . , SR_N−1 and SR_N are coupled to one signal output terminal Output_1, Output_2, . . . , Output_N−1 of the shift registers in the previous stages, respectively.

It should be noted that, in a case where the number of signal output terminal of each of the shift registers SR_1, SR_2, . . . , SR_N−1 and SR_N is one (e.g., as shown in the embodiment of FIG. 2), the signal output terminal is the drive signal output terminal, the drive signal output terminals Output_1, Output_2, . . . , Output_N−1 and Output_N are coupled to both the gate lines Gate_1, Gate_2, . . . , Gate_N−1 and Gate_N in corresponding rows and the write signal input terminals Input of the shift registers in next stages, respectively, and signals output from the drive signal output terminals Output_1, Output_2, . . . , Output_N−1 and Output_N may drive the gate lines in corresponding rows and function as the write signals for the shift registers in next stages, respectively.

The gate drive circuit may further include a high level power supply voltage line VGH and a low level power supply voltage line VGL. The high level power supply voltage line VGH is coupled to power supply terminals (e.g., the first power supply terminal, the third power supply terminal and the fourth power supply terminal) of the shift registers that output the high level operating voltage VDD, and the low level power supply voltage line VGL is coupled to power supply terminals (e.g., the second power supply terminal and the fifth power supply terminal) of the shift registers that output the low level operating voltage VSS.

Figure 7:
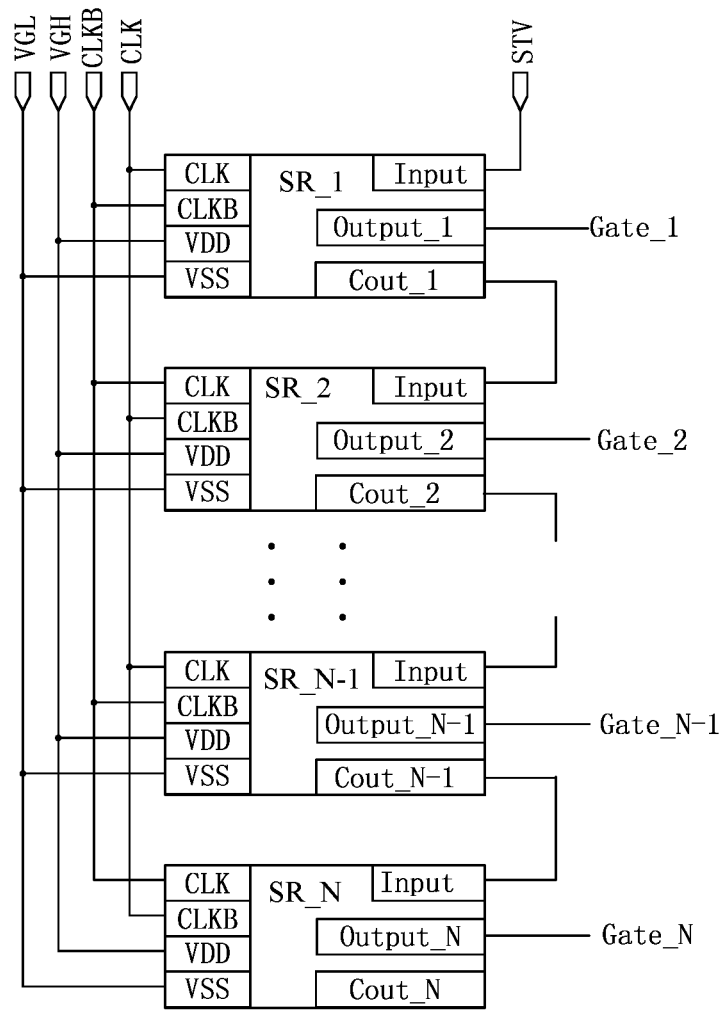
FIG. 7 is a schematic diagram showing a structure of another gate drive circuit according to an embodiment of the present disclosure.

FIG. 7 is a schematic diagram showing a structure of another gate drive circuit according to an embodiment of the present disclosure. The gate drive circuit shown in FIG. 7 differs from that shown in FIG. 6 in that, each of the shift registers SR_1, SR_2, . . . , SR_N–1 and SR_N of the gate drive circuit shown in FIG. 7 includes two signal output terminals (as shown in the embodiment of FIG. 4), and thus these signal output terminals are the cascade signal output terminals Cout_1, Cout_2, . . . , Cout_N–1 and Cout_N and the drive signal output terminals Output_1, Output_2, . . . , Output_N–1 and Output_N, respectively. One signal output terminal of each shift register is coupled to one of the gate lines Gate_1, Gate_2, . . . , Gate_N–1 and Gate_N in a row corresponding to the shift register in the present stage, to provide the drive signal to the gate line, and the other signal output terminal of each shift register is coupled to the write signal input terminal Input of the shift register in the next stage, to provide the write signal thereto.

In the present embodiment, the drive signal output terminals Output_1, Output_2, . . . , Output_N–1 and Output_N may be coupled to the gate lines Gate_1, Gate_2, . . . , Gate_N–1 and Gate_N in corresponding rows, respectively, and the cascade signal output terminals Cout_1, Cout_2, . . . , Cout_N–1 are coupled to the write signal input terminals Input of the shift registers in the next stages, respectively. The write signal input terminals Input of the shift registers in the other stages than the first stage are coupled to the cascade signal output terminals of the shift registers in the previous stages, respectively. It should be noted that, in a case where the gate drive circuit includes N shift registers in respective stages, there is no a shift register following the shift register in the $N^{th}$ stage. Thus, the cascade signal output terminal Cout_N of the shift register in the $N^{th}$ stage may not be coupled to any signal line.

Similar to the embodiment of FIG. 6, the gate drive circuit shown in FIG. 7 may further include a high level power supply voltage line VGH and a low level power supply voltage line VGL. The high level power supply voltage line VGH is coupled to power supply terminals of the shift registers that output the high level operating voltage VDD, and the low level power supply voltage line VGL is coupled to power supply terminals of the shift registers that output the low level operating voltage VSS.

As describe above, the gate drive circuit according to the embodiment of the present disclosure may include the plurality of shift registers cascaded in respective stages, and each of the shift registers can implement a self-reset without a reset signal. Thus, it is not necessary for the gate drive circuit to include the reset signal input terminal and a signal trace for the reset signal input terminal, thereby reducing the size of the gate drive circuit, which is advantageous for a border region of a display device to be narrowed down.

An embodiment of the present disclosure provides a display device, which may include the gate drive circuit provided by the embodiment shown in FIG. 6 or 7. Detailed description of the gate drive circuit may be referred to the foregoing description with reference to the FIG. 6 or 7, and will not be repeated here.

It should be understood that, the above embodiments are only exemplary embodiments for the purpose of explaining the principle of the present disclosure, and the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. A shift register, comprising a write circuit, a pull-down control circuit and an output circuit, the write circuit, the pull-down control circuit and the output circuit are all coupled to a pull-up node, the pull-down control circuit and the output circuit are coupled to a pull-down node, wherein
the write circuit is coupled to a first clock signal input terminal and a write signal input terminal, and configured to, in response to control of a first clock signal provided by the first clock signal input terminal, write a write signal provided by the write signal input terminal to the pull-up node;
the pull-down control circuit is coupled to the first clock signal input terminal and a first power supply terminal, and configured to, in response to control of the first clock signal and a voltage of the pull-up node, write a first operating voltage provided by the first power supply terminal to the pull-down node, and write the first clock signal to the pull-down node; and
the output circuit is coupled to a drive signal input terminal, a drive signal output terminal and a second power supply terminal, and configured to write a drive signal provided by the drive signal input terminal to the drive signal output terminal in response to control of the voltage of the pull-up node, and write a second operating voltage provided by the second power supply terminal to the drive signal output terminal in response to control of a voltage of the pull-down node,
wherein the pull-down control circuit comprises a first transistor and a second transistor;
the first transistor comprises a control electrode coupled to the first clock signal input terminal, a first electrode coupled to the first power supply terminal to receive the first operating voltage, and a second electrode coupled to the pull-down node; and
the second transistor comprises a control electrode coupled to the pull-up node, a first electrode coupled to the pull-down node, and a second electrode coupled to the first clock signal input terminal to receive the first clock signal.

2. The shift register according to claim 1, wherein the write circuit comprises a third transistor; and
the third transistor comprises a control electrode coupled to the first clock signal input terminal, a first electrode coupled to the write signal input terminal to receive the write signal, and a second electrode coupled to the pull-up node.

3. The shift register according to claim 1, further comprising a feedback-loop circuit, wherein
the feedback-loop circuit is coupled to the pull-up node, and configured to receive the voltage of the pull-up node, and cause the voltage of the pull-up node to be self-boosted based on positive feedback of the feedback-loop circuit.

4. The shift register according to claim 3, wherein the feedback-loop circuit comprises an eighth transistor, a ninth transistor and a tenth transistor;
the eighth transistor comprises a control electrode coupled to a fourth power supply terminal, a first electrode coupled to the fourth power supply terminal to receive a fourth operating voltage provided by the fourth power supply terminal, and a second electrode coupled to a first electrode of the ninth transistor;

the ninth transistor comprises a control electrode coupled to the pull-up node, the first electrode coupled to a control electrode of the tenth transistor, and a second electrode coupled to a fifth power supply terminal to receive a fifth operating voltage provided by the fifth power supply terminal; and the tenth transistor comprises a first electrode coupled to the pull-up node, and a second electrode coupled to the fifth power supply terminal to receive the fifth operating voltage.

5. The shift register according to claim 1, further comprising a voltage regulator circuit, wherein the voltage regulator circuit is coupled to the pull-down node, and configured to stabilize the voltage of the pull-down node.

6. The shift register according to claim 5, wherein the voltage regulator circuit comprises a second capacitor; and the second capacitor comprises a first terminal coupled to the pull-down node and a second terminal coupled to the second power supply terminal.

7. The shift register according to claim 6, wherein the pull-down control circuit comprises a first transistor and a second transistor;

the first transistor comprises a control electrode coupled to the first clock signal input terminal, a first electrode coupled to the first power supply terminal to receive the first operating voltage, and a second electrode coupled to the pull-down node;

the second transistor comprises a control electrode coupled to the pull-up node, a first electrode coupled to the pull-down node, and a second electrode coupled to the first clock signal input terminal to receive the first clock signal;

the write circuit comprises a third transistor; and the third transistor comprises a control electrode coupled to the first clock signal input terminal, a first electrode coupled to the write signal input terminal to receive the write signal, and a second electrode coupled to the pull-up node.

8. The shift register according to claim 7, further comprising a feedback-loop circuit, wherein the feedback-loop circuit is coupled to the pull-up node, and configured to receive the voltage of the pull-up node, and cause the voltage of the pull-up node to be self-boosted based on positive feedback of the feedback-loop circuit;

the feedback-loop circuit comprises an eighth transistor, a ninth transistor and a tenth transistor;

the eighth transistor comprises a control electrode coupled to a fourth power supply terminal, a first electrode coupled to the fourth power supply terminal to receive a fourth operating voltage provided by the fourth power supply terminal, and a second electrode coupled to a first electrode of the ninth transistor;

the ninth transistor comprises a control electrode coupled to the pull-up node, the first electrode coupled to a control electrode of the tenth transistor, and a second electrode coupled to a fifth power supply terminal to receive a fifth operating voltage provided by the fifth power supply terminal; and the tenth transistor comprises a first electrode coupled to the pull-up node, and a second electrode coupled to the fifth power supply terminal to receive the fifth operating voltage.

9. The shift register according to claim 8, wherein the drive signal input terminal is a second clock signal input terminal, and the drive signal is a second clock signal provided by the second clock signal input terminal;

the output circuit comprises a fourth transistor, a fifth transistor and a first capacitor;

the fourth transistor comprises a control electrode coupled to the pull-up node, a first electrode coupled to the second clock signal input terminal to receive the second clock signal, and a second electrode coupled to the drive signal output terminal;

the fifth transistor comprises a control electrode coupled to the pull-down node, a first electrode coupled to the drive signal output terminal, and a second electrode coupled to the second power supply terminal to receive the second operating voltage; and the first capacitor comprises a first terminal coupled to the pull-up node and a second terminal coupled to the drive signal output terminal.

10. The shift register according to claim 8, wherein the output circuit is further coupled to a cascade signal input terminal and a cascade signal output terminal;

the output circuit comprises a cascade signal output sub-circuit and a drive signal output sub-circuit;

the cascade signal output sub-circuit is coupled to the pull-up node, the pull-down node, the cascade signal input terminal, the cascade signal output terminal and the second power supply terminal, and configured to write a cascade signal provided by the cascade signal input terminal to the cascade signal output terminal in response to the control of the voltage of the pull-up node, and write the second operating voltage provided by the second power supply terminal to the cascade signal output terminal in response to the control of the voltage of the pull-down node; and the drive signal output sub-circuit is coupled to the cascade signal output terminal, the pull-down node, the drive signal input terminal, the drive signal output terminal and the second power supply terminal, and configured to write the drive signal provided by the drive signal input terminal to the drive signal output terminal in response to control of a voltage of the cascade signal output terminal, and write the second operating voltage provided by the second power supply terminal to the drive signal output terminal in response to the control of the voltage of the pull-down node.

11. The shift register according to claim 10, wherein the cascade signal input terminal is a second clock signal input terminal, and the cascade signal is a second clock signal provided by the second clock signal input terminal;

the cascade signal output sub-circuit comprises a fourth transistor, a fifth transistor and a first capacitor;

the fourth transistor comprises a control electrode coupled to the pull-up node, a first electrode coupled to the second clock signal input terminal to receive the second clock signal, and a second electrode coupled to the cascade signal output terminal;

the fifth transistor comprises a control electrode coupled to the pull-down node, a first electrode coupled to the cascade signal output terminal, and a second electrode coupled to the second power supply terminal to receive the second operating voltage;

the first capacitor comprises a first terminal coupled to the pull-up node and a second terminal coupled to the cascade signal output terminal;

the drive signal input terminal is a third power supply terminal, and the drive signal is a third operating voltage provided by the third power supply terminal;

the drive signal output sub-circuit comprises a sixth transistor and a seventh transistor;

the sixth transistor comprises a control electrode coupled to the cascade signal output terminal, a first electrode coupled to the third power supply terminal to receive the third operating voltage, and a second electrode coupled to the drive signal output terminal; and the seventh transistor comprises a control electrode coupled to the pull-down node, a first electrode coupled to the drive signal output terminal, and a second electrode coupled to the second power supply terminal to receive the second operating voltage.

12. A method for driving a shift register, wherein the shift register is the shift register according to claim 1, the method comprises steps of in a precharge stage, writing the write signal in a first level state to the pull-up node by the write circuit, writing the first operating voltage to the pull-down node by the pull-down control circuit, and writing the second operating voltage to the drive signal output terminal by the output circuit;

in a drive stage, causing the write circuit to stop writing, writing the first clock signal in a second level state to the pull-down node by the pull-down control circuit, and writing the drive signal to the drive signal output terminal by the output circuit; and in a reset stage, writing the write signal in the second level state to the pull-up node by the write circuit, writing the first operating voltage to the pull-down node by the pull-down control circuit, and writing the second operating voltage to the drive signal output terminal by the output circuit.

13. A gate drive circuit, comprising a plurality of shift registers cascaded in respective stages and a frame trigger signal input terminal that is configured to input a frame trigger signal, wherein each of the plurality of shift registers is the shift register according to claim 1;

the write signal input terminal of the shift register in a first stage is coupled to the frame trigger signal input terminal; and the write signal input terminal of each of the shift registers in the remaining stages other than the first stage is coupled to one signal output terminal of the shift register in its previous stage.

14. The gate drive circuit according to claim 13, wherein the output circuit is further coupled to a cascade signal input terminal and a cascade signal output terminal;

the output circuit comprises a cascade signal output sub-circuit and a drive signal output sub-circuit;

the cascade signal output sub-circuit is coupled to the pull-up node, the pull-down node, the cascade signal input terminal, the cascade signal output terminal and the second power supply terminal, and configured to write a cascade signal provided by the cascade signal input terminal to the cascade signal output terminal in response to the control of the voltage of the pull-up node, and write the second operating voltage provided by the second power supply terminal to the cascade signal output terminal in response to the control of the voltage of the pull-down node;

the drive signal output sub-circuit is coupled to the cascade signal output terminal, the pull-down node, the drive signal input terminal, the drive signal output terminal and the second power supply terminal, and configured to write the drive signal provided by the drive signal input terminal to the drive signal output terminal in response to control of a voltage of the cascade signal output terminal, and write the second operating voltage provided by the second power supply terminal to the drive signal output terminal in response to the control of the voltage of the pull-down node; and the write signal input terminal of each of the shift registers in the remaining stages other than the first stage is coupled to the cascade signal output terminal of the shift register in its previous stage.

15. A display device, comprising the gate drive circuit according to claim 13.

16. A shift register, comprising a write circuit, a pull-down control circuit and an output circuit, the write circuit, the pull-down control circuit and the output circuit are all coupled to a pull-up node, the pull-down control circuit and the output circuit are coupled to a pull-down node, wherein the write circuit is coupled to a first clock signal input terminal and a write signal input terminal, and configured to, in response to control of a first clock signal provided by the first clock signal input terminal, write a write signal provided by the write signal input terminal to the pull-up node;

the pull-down control circuit is coupled to the first clock signal input terminal and a first power supply terminal, and configured to, in response to control of the first clock signal and a voltage of the pull-up node, write a first operating voltage provided by the first power supply terminal to the pull-down node, and write the first clock signal to the pull-down node; and the output circuit is coupled to a drive signal input terminal, a drive signal output terminal and a second power supply terminal, and configured to write a drive signal provided by the drive signal input terminal to the drive signal output terminal in response to control of the voltage of the pull-up node, and write a second operating voltage provided by the second power supply terminal to the drive signal output terminal in response to control of a voltage of the pull-down node, wherein the drive signal input terminal is a second clock signal input terminal, and the drive signal is a second clock signal provided by the second clock signal input terminal;

the output circuit comprises a fourth transistor, a fifth transistor and a first capacitor;

the fourth transistor comprises a control electrode coupled to the pull-up node, a first electrode coupled to the second clock signal input terminal to receive the second clock signal, and a second electrode coupled to the drive signal output terminal;

the fifth transistor comprises a control electrode coupled to the pull-down node, a first electrode coupled to the drive signal output terminal, and a second electrode coupled to the second power supply terminal to receive the second operating voltage; and the first capacitor comprises a first terminal coupled to the pull-up node and a second terminal coupled to the drive signal output terminal.

17. A shift register, comprising a write circuit, a pull-down control circuit and an output circuit, the write circuit, the pull-down control circuit and the output circuit are all coupled to a pull-up node, the pull-down control circuit and the output circuit are coupled to a pull-down node, wherein the write circuit is coupled to a first clock signal input terminal and a write signal input terminal, and configured to, in response to control of a first clock signal provided by the first clock signal input terminal, write a write signal provided by the write signal input terminal to the pull-up node;

the pull-down control circuit is coupled to the first clock signal input terminal and a first power supply terminal, and configured to, in response to control of the first clock signal and a voltage of the pull-up node, write a first operating voltage provided by the first power supply terminal to the pull-down node, and write the first clock signal to the pull-down node; and the output circuit is coupled to a drive signal input terminal, a drive signal output terminal and a second power supply terminal, and configured to write a drive signal provided by the drive signal input terminal to the drive signal output terminal in response to control of the voltage of the pull-up node, and write a second operating voltage provided by the second power supply terminal to the drive signal output terminal in response to control of a voltage of the pull-down node, wherein the output circuit is further coupled to a cascade signal input terminal and a cascade signal output terminal;

the output circuit comprises a cascade signal output sub-circuit and a drive signal output sub-circuit;

the cascade signal output sub-circuit is coupled to the pull-up node, the pull-down node, the cascade signal input terminal, the cascade signal output terminal and the second power supply terminal, and configured to write a cascade signal provided by the cascade signal input terminal to the cascade signal output terminal in response to the control of the voltage of the pull-up node, and write the second operating voltage provided by the second power supply terminal to the cascade signal output terminal in response to the control of the voltage of the pull-down node; and the drive signal output sub-circuit is coupled to the cascade signal output terminal, the pull-down node, the drive signal input terminal, the drive signal output terminal and the second power supply terminal, and configured to write the drive signal provided by the drive signal input terminal to the drive signal output terminal in response to control of a voltage of the cascade signal output terminal, and write the second operating voltage provided by the second power supply terminal to the drive signal output terminal in response to the control of the voltage of the pull-down node.

18. The shift register according to claim 17, wherein the cascade signal input terminal is a second clock signal input terminal, and the cascade signal is a second clock signal provided by the second clock signal input terminal;

the cascade signal output sub-circuit comprises a fourth transistor, a fifth transistor and a first capacitor;

the fourth transistor comprises a control electrode coupled to the pull-up node, a first electrode coupled to the second clock signal input terminal to receive the second clock signal, and a second electrode coupled to the cascade signal output terminal;

the fifth transistor comprises a control electrode coupled to the pull-down node, a first electrode coupled to the cascade signal output terminal, and a second electrode coupled to the second power supply terminal to receive the second operating voltage; and the first capacitor comprises a first terminal coupled to the pull-up node and a second terminal coupled to the cascade signal output terminal.

19. The shift register according to claim 17, wherein the drive signal input terminal is a third power supply terminal, and the drive signal is a third operating voltage provided by the third power supply terminal;

the drive signal output sub-circuit comprises a sixth transistor and a seventh transistor;

the sixth transistor comprises a control electrode coupled to the cascade signal output terminal, a first electrode coupled to the third power supply terminal to receive the third operating voltage, and a second electrode coupled to the drive signal output terminal; and the seventh transistor comprises a control electrode coupled to the pull-down node, a first electrode coupled to the drive signal output terminal, and a second electrode coupled to the second power supply terminal to receive the second operating voltage.

* * * * *